(12) United States Patent
Beaver

(10) Patent No.: US 6,590,315 B2
(45) Date of Patent: *Jul. 8, 2003

(54) SURFACE MOUNT QUARTZ CRYSTAL RESONATORS AND METHODS FOR MAKING SAME

(76) Inventor: William D. Beaver, 9A Claymore Garden, 3 Luk Fung Path, Fotan, N.T. (HK)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/583,005

(22) Filed: May 26, 2000

(65) Prior Publication Data

US 2002/0089261 A1 Jul. 11, 2002

(51) Int. Cl.[7] .............................................. H01L 41/08
(52) U.S. Cl. ...................................................... 310/348
(58) Field of Search ................................. 310/361, 358, 310/366, 367, 348, 346, 368, 36, 336, 338, 370, 351

(56) References Cited

U.S. PATENT DOCUMENTS

| | | | | |
|---|---|---|---|---|
| 4,313,071 A | * | 1/1982 | Hermann et al. | 310/361 |
| 4,451,754 A | * | 5/1984 | Stolz et al. | 310/348 |
| 4,499,395 A | * | 2/1985 | Kahan | 310/361 |
| 5,541,469 A | * | 7/1996 | Kaida | 310/367 |
| 5,596,243 A | * | 1/1997 | Tsuru et al. | 310/348 |

OTHER PUBLICATIONS

Quartz Crystal Devices Short Form Catalog, Interquip Limited, 1998.

* cited by examiner

*Primary Examiner*—Thomas M. Dougherty
*Assistant Examiner*—Karen Addison
(74) *Attorney, Agent, or Firm*—Stout, Uxa, Buyan & Mullins, LLP; Frank J. Uxa; Greg S. Hollrigel

(57) ABSTRACT

A surface mount quartz crystal resonator includes a quartz crystal-based plate including a central portion adapted to resonate at a desired frequency, and a border substantially surrounding a peripheral region of the central portion. The border includes a first region physically separated from the central portion, and a second region joined to the central portion. A base plate is provided which is secured to the plate so that the central portion of the plate is free to resonate relative to the base plate. A cover plate is provided and is secured to the plate so that the plate is located between the base plate and the cover plate. At least one, and preferably both, of the base plate and the cover plate are made of quartz.

23 Claims, 6 Drawing Sheets

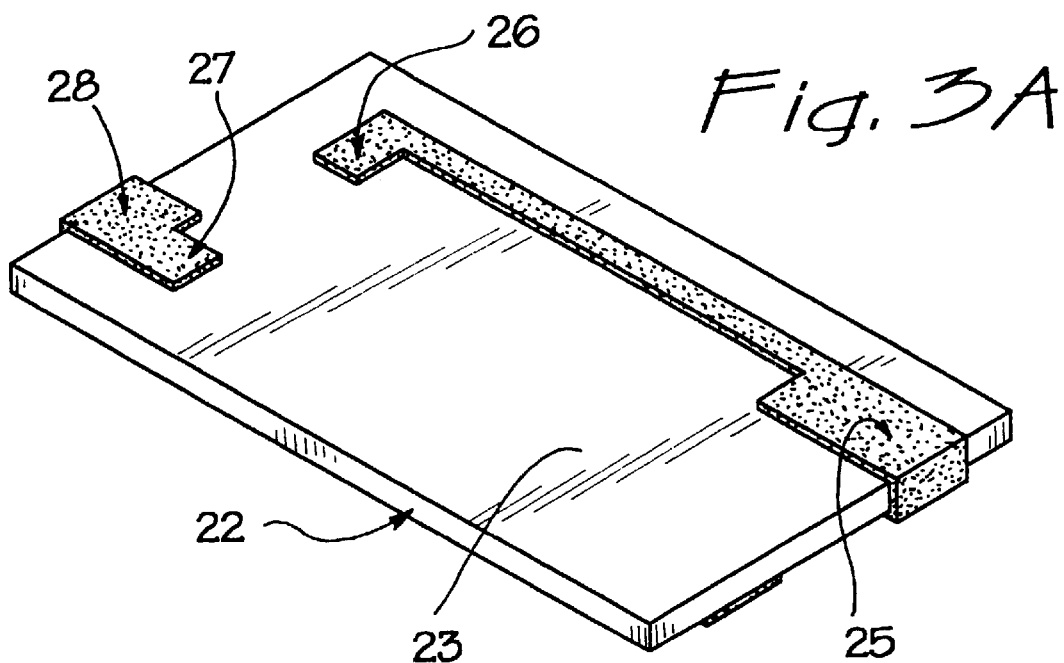
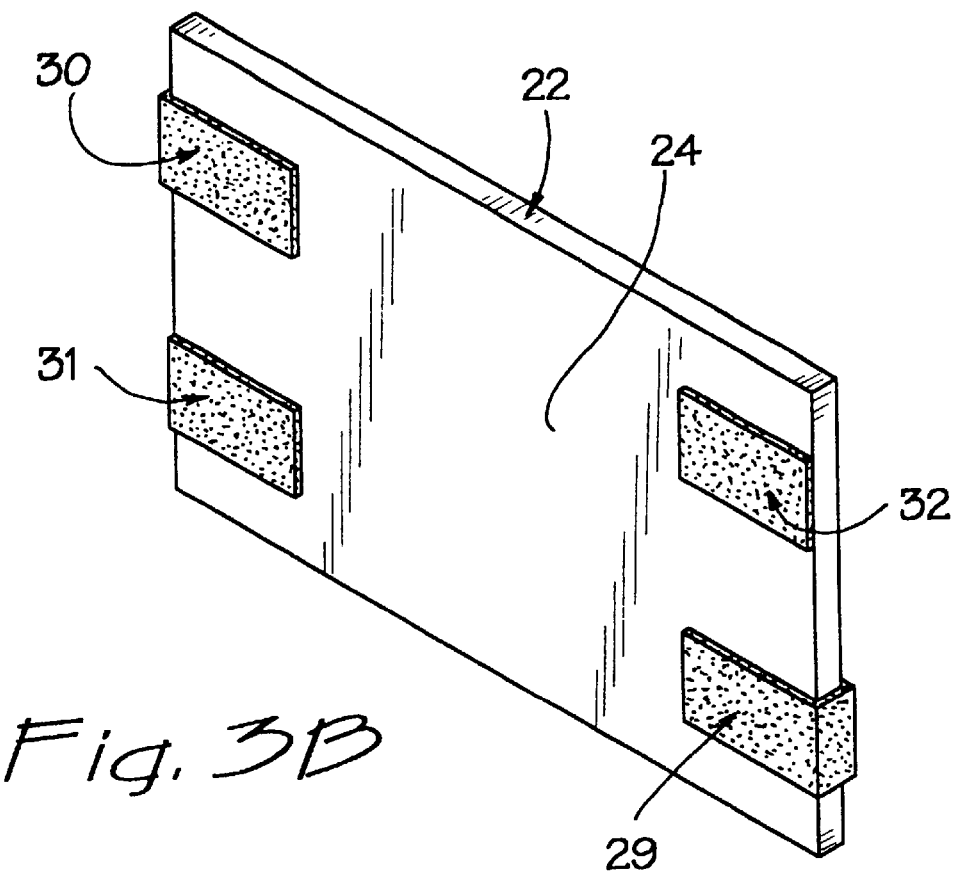

SURFACE MOUNT QUARTZ CRYSTAL RESONATORS AND METHODS FOR MAKING SAME

BACKGROUND OF THE INVENTION

The present invention relates to quartz crystal resonators and methods for making same. More particularly, the invention relates to surface mount quartz crystal resonators, and methods of making such resonators, which are straightforward in construction, inexpensive to manufacture, and effective and durable in use.

Quartz crystal resonators, because of their frequency accuracy and stability, are indispensable in modern electronics, for example, in telecommunications, computers, entertainment equipment and the like, as well as in other applications, many of which are well known. As used herein, a quartz crystal resonator, is a device comprising a piezoelectric quartz crystal element in the form of a thin plate, for example, a circular or rectangular plate, and an enclosure which can be sealed by some means to form a hermetic seal. Electrical terminals are provided which pass into the enclosure to provide the means to apply an alternating voltage across the quartz crystal element causing the element to vibrate. The piezoelectric quartz element has a set of thin conductive metallic electrodes deposited onto its major surfaces. The over lapping area of the electrode on one side of the plate with that of the electrode on the other side of the plate defines the resonating portion of the quartz element. The piezoelectric quartz crystal element resonates when the alternating voltage has the frequency of the resonant frequency of the quartz element, is applied. The resonant frequency of the quartz crystal element is determined by the piezoelectric and elastic constants of quartz, the dimensions of the quartz element, the metallic electrodes and other secondary factors.

Conventionally, surface mount quartz crystal resonators were made up of an electroded piezoelectric quartz crystal plate and a ceramic enclosure or base. The quartz crystal resonator plate is fixed in or on the ceramic enclosure by electrically conductive epoxy applied at two points on one end of the quartz crystal plate. A metal cover is welded to a metal flange on the ceramic enclosure. Alternately, a ceramic cover, is joined to the ceramic enclosure or base by means of adhesive or by reflow of low melting point glass.

The ceramic enclosures or bases are of laminated ceramic construction which employs a combination of cofired metallic depositions, metal vias and ceramic-to-metal seals. These ceramic components require a high level of technology to manufacture, are comparatively expensive, and have historically been in short supply.

It would be advantageous to provide surface mount quartz crystal resonators which are straightforward in construction, inexpensive to manufacture and effective and durable in use.

SUMMARY OF THE PRESENT INVENTION

New surface mount quartz crystal resonators and methods for making same have been developed. The present resonators are straightforward in construction, relatively inexpensive to manufacture, effective in use, for example, in electronic equipment such as computers, handheld cell phones, wireless control and data transmission systems and the like, and do not rely on materials or components which have historically been in short supply. For example, the present surface mount quartz crystal resonators do not require, and preferably do not include, the ceramic enclosures or bases referred to above. Thus, the present invention avoids dealing with such ceramic enclosures or bases and the problems attendant thereto. Preferably, the present quartz crystal resonators are encapsulated in a base plate of quartz and a cover plate of quartz. Importantly, the present surface mount quartz crystal resonators when installed in the application circuit have substantial, preferably enhanced, resistence to shock and vibration. Also, the present resonators can be produced with a reduced height and/or profile relative to the resonators of the prior art. The present methods of producing surface mount quartz crystal resonators are straightforward to practice and provide a cost effective approach to producing surface mount quartz crystal resonators.

One important aspect of the present invention relates to resonator plates, which are a major component of the present quartz crystal resonators. In general, the present resonator plates comprise a quartz crystal-based plate or plate member including a central portion or region having a peripheral region, for example, around the width and length of the central portion. The central portion is adapted to resonate at a desired frequency, preferably in response to an alternating voltage being applied across the central region. A border or border portion is provided which substantially surrounds the peripheral region of the central portion. The border includes a first region physically separated or spaced apart from the central region, and a second region joined to the central portion.

In use, the central portion of the quartz crystal-based plate resonates at a desired frequency preferably in response to the application of an alternating voltage, while the border of the plate remains substantially stationary, as will be described hereinafter. Thus, only a portion of the quartz crystal-based plate resonates. The other portion, that is the border, of the plate is used to support the resonating central portion and to provide part of the housing or enclosure of the surface mount resonator.

The first region of the border which is physically separated from the central portion of the plate member preferably is formed by removal of quartz from a solid quartz crystal plate. In one embodiment, a solid quartz crystal plate is provided and a quantity of quartz is removed, for example, forming a slot, so that the first region of the border is spaced apart, for example, by the formed slot, from the resonating central portion.

The outer periphery of the quartz crystal-based plate may be of any suitable geometric shape, for example, suitable for use in a surface mount quartz crystal resonator. Particularly useful geometric shapes include a substantially circular shape, a substantially rectangular shape and the like. In one particularly useful embodiment, the quartz crystal-based plate has a rectangular outer periphery and includes a slot located between the central portion and the first region. The slot is located inwardly of the outer periphery along at least three sides of the rectangular outer periphery.

The central region of the quartz crystal-based plate preferably is provided with electrodes to facilitate the application of an alternating voltage. In one particularly useful embodiment, a first electrode is provided on the top surface of the central portion and a second electrode is provided on an opposing bottom surface of the central portion.

The thickness of the central portion may be substantially uniform or may be variable. In one very useful embodiment, the thickness of the central portion preferably is reduced in the region or regions of the central portion which are outside of the resonant region defined by the overlapping electrodes. For example, the thickness of the central region may be reduced in one or more regions of the central portion on which neither first nor second electrode is provided. This feature will be discussed in detail hereinafter.

In another very useful embodiment the thickness of the central portion is essentially uniform but is substantially or significantly reduced relative to the thickness of the border. This feature will be discussed in detail hereinafter.

In another broad aspect of the present invention, resonator assemblies are provided which comprise a quartz crystal-based plate or plate member, as described elsewhere herein, and a base plate secured to the plate so that the central portion of the plate is free to resonate relative to the base plate, for example, in response to an appropriate alternating voltage being applied thereto, across the plate. The base plate is secured to the border of the quartz crystal-based plate, preferably along substantially the entire outer portion of the border. This securement of the base plate to the border of the quartz crystal-based plate provides a substantially strong mechanical bond between the plate member and the base plate. This enhances the durability of the present resonators, for example, relative to the prior art resonators, which enhances the effective life of the present resonators.

Although the base plate and quartz crystal-based plate can be secured using various techniques, it is preferred that adhesives be employed. Thus, the assembly preferably includes an adhesive located between the base plate and the border of the quartz crystal-based plate. This adhesive is effective in securing the base plate to the border. A suitable adhesive may be employed. One particularly useful class of adhesives are epoxy-based adhesives.

Although the base plate may be comprised of any suitable material of construction, for example, metals, glasses, ceramics and the like, the preferred material of construction is quartz. The use of quartz is very effective in reducing costs while substantially matching the physical characteristics of the quartz crystal-based plate.

The base plate preferably includes a plurality of base electrodes positioned so that one base electrode is in electrical connection with the first electrode of the central portion of the plate member and another base electrode is in electrical connection with the second electrode of the central portion. Such base electrodes are very effective in providing the alternating voltage signal from a remote source to the resonating central portion of the plate member.

The electrodes described herein may be constructed of any suitable electrically conductive material. However, it is preferred that such electrodes comprise metals. The electrodes can be provided in any suitable manner. Preferably, the electrodes are provided by vacuum deposition onto the surface, as desired.

Quartz crystal resonators, in accordance with the present invention, include the quartz crystal-based plate and base plate, as described elsewhere herein, and, in addition, a cover plate secured to the quartz crystal-based plate so that the plate is located between the base plate and the cover plate. Preferably, the base plate and the cover plate are both secured to the border of the quartz crystal-based plate. More preferably, both the base plate and the cover plate are secured to substantially the entire outer portion of the border so that the resonator is firmly mechanically bonded together and the resonating central portion of the quartz crystal-based plate is hermetically sealed or enclosed.

In one embodiment, a first adhesive is provided which is located between the base plate and the border and is effective in securing the base plate to the border, and a second adhesive is provided and located between the cover plate and the border and is effective in securing the cover plate to the border. The compositions of the first and second adhesives may be the same or different, preferably the same.

Although any suitable material may be employed as the cover plate, the cover plate preferably comprises quartz. Thus, in one particularly useful embodiment, the quartz crystal-based plate, base plate and cover plate all comprise quartz. In one useful embodiment, at least one of the base plate and the cover plate includes an outwardly extending recess. This feature will be described in more detail hereinafter.

In another broad aspect of the present invention, methods for producing quartz crystal resonators are provided. Such methods include providing a solid quartz crystal plate. Quartz is removed from the solid quartz crystal plate to form a quartz crystal plate member including a central portion, a border and a space, preferably a slot, between the central portion and the border including a first region separated from the central portion and a second region joined to the central portion. First and second electrodes are placed on the top surface and the opposing bottom surface of the plate member, respectively. The plate member is secured to an electroded base plate so that the central region is free to resonate relative to the base plate, preferably in response to an alternating voltage being applied to the central region. The plate member is secured to a cover plate so that the plate member is located between the base and the cover plate.

In one embodiment, the base plate and the cover plate both comprise quartz and the securing steps include the use of adhesives to secure the plate member to the base plate and the plate member to the cover plate, respectively. The securing steps are effective to both mechanically bond the base plate, the plate member and the cover plate together, and form a hermetically sealed periphery. Electrically conductive adhesive, preferably electrically conductive epoxy adhesive, is employed to make contacts between the electrodes which are deposited on the central portion and the electrodes which are deposited onto the base plate which complete the electrical circuit of the resonator.

Each and every feature described herein, and each and every combination of two or more of such features, is included within the scope of the present invention provided that the features included in such a combination are not mutually inconsistent.

These and other aspects and advantages of the present invention are set forth in the following detailed description and claims, particularly when considered in conjunction with the accompanying drawings in which like parts bear like reference numerals.

BRIEF DESCRIPTION OF THE DRAWINGS

FIG. 3A is a perspective illustration of the upper internal surface electrode pattern of a quartz base plate in accordance with the present invention;

FIG. 3B is a perspective illustration of the lower external surface electrode pattern of the quartz base plate in accordance with the present invention;

DETAILED DESCRIPTION

Figure 1:
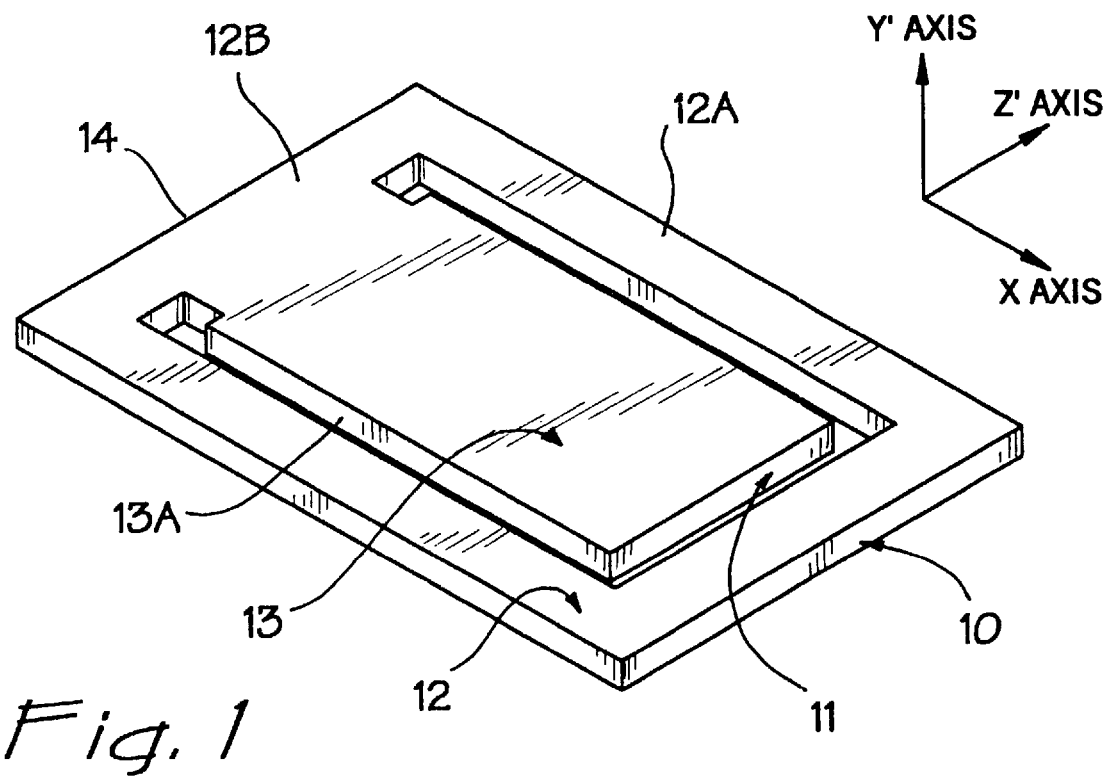
FIG. 1 is a top front view, in perspective, of a piezoelectric quartz crystal resonator plate in accordance with the present invention.

Referring now to FIG. 1, a rectangular piezoelectric quartz crystal plate 10 is shown. A decoupling slot 11 has been formed in the plate 10 by removing a narrow section of quartz along three sides of the plate 10 and partially along fourth side 14. The forming of the decoupling slot 11 creates a central resonant part 13 of quartz and a border 12 of quartz around the peripheral region 13A of central resonant part. The border 12 includes a first region 12A which is spaced apart, by slot 11, from resonant part 13, and a second region 12B which is joined to the resonant part. The amount of removal along the fourth side 14 of the plate 10 depends on how strong the second region 12B joining the border 12 and the resonant part 13 is desired to be. Second region 12B is strongest if no quartz is removed parallel to the fourth side 14 of the plate 10. In the embodiment of the invention being described, the length of the quartz plate 10 is shown to be parallel with the X Axis, referred to as the crystallographic axes of the quartz crystal and the AT-cut of quartz crystal which is commonly employed for high frequency quartz crystal resonators. The width of plate 10 is parallel to the Z' Axis and the thickness of the plate is parallel to the Y' Axis.

Without wishing to limit the invention, typical dimensions of quartz plate 10 include a length in the range of about 3.2 mm to about 12 mm, for example, about 7.5 mm; a width in the range of about 2.5 mm to about 5.5 mm, for example, about 5 mm; and a thickness dependent on the resonating frequency according to the following relationship $$t = \frac{1.65}{F} \qquad \text{EQN. 1}$$

where t is thickness in mm and F is the resonating frequency in MHZ which can often range from about 8 MHz to about 50 MHz.

With the plate 10 formed as shown in FIG. 1, stresses which are applied to the sides of the plate 10 to the first region 12A of border 12 outside of the decoupling slot 11 have no influence on the resonant characteristics of the resonant part 13. Stresses applied to the fourth side 14 result in some strain in the resonant part 13. However, because the resonant part 13 is free to move without interference from the other three sides of the border 12 of plate 10, the effect of the strain from the fourth side 14 on the resonant characteristics are very small, if noticeable at all.

The forming of the quartz plate 10 in the way shown in FIG. 1 provides a resonant part 13 of the plate 10 which is substantially mechanically isolated from the border 12 of the plate so that the border of the plate may be incorporated into the enclosure structure of the quartz crystal resonator to be made from plate 10 without detriment to the resonant characteristics of the final product.

Figure 2:
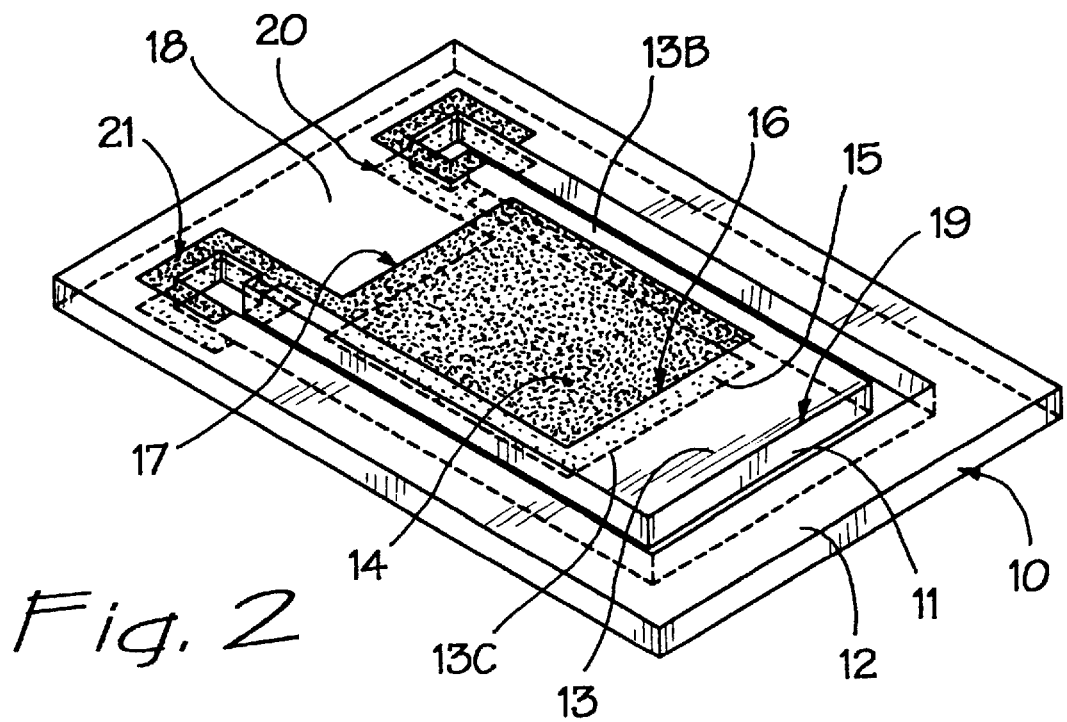
FIG. 2 is a perspective illustration of the plate shown in FIG. 1 with conductive metallic electrodes coating the major surfaces.

In order to apply an electrical signal across the resonant part 13 of the quartz plate 10, conductive metallic electrodes 14 and 15 are vacuum deposited opposite each other, on the top or first major surface 13B and the bottom or second major surface 13C, respectively, of resonant part 13 of the quartz plate 10, as is shown in FIG. 2.

The dimensions of the electrodes 14, 15 depend on the values of the parameters of the equivalent electrical circuit which the final quartz crystal resonator is being designed to meet and the size limitations that may apply because of the application involved. However, the thickness of the electrodes 14, 15 and the density of the metal that is employed for the electrodes 14, 15 are primary factors that determine the reduction in frequency of the resonant part 13 of the quartz plate 10 from the frequency that is apparent when no electrodes have been applied to the resonant part 13, which is referred to as the unelectroded frequency. The ratio of the amount of the reduction of the resonant frequency to the unelectroded frequency is commonly called the mass loading of the electrode, which is expressed by the equation, $$\Delta = \frac{f_u - f_e}{f_u} = \text{mass loading,} \qquad \text{EQN. 2}$$

where $f_u$ is the unelectroded frequency of the resonant part, and $f_e$ is the frequency of the electroded resonant part. A result of acoustic wave considerations shows that the thickness shear wave that is driven between the electrodes 14, 15 at frequency $f_e$ cannot propagate into the unelectroded areas of the resonant part 13 and the amplitude of the acoustic displacement exponentially decreases as the wave radiates towards the edges 18, 19 of the resonant part 13.

Since the energy of the wave is proportional to the square of the acoustic displacement, the energy of the wave also exponentially decreases as it radiates from the electrode edges 16, 17 toward the edges 18, 19 of the resonant part 13 of the quartz plate 10. This phenomenon is termed energy trapping and is well known in the quartz device industry. Energy that reaches the edges 18, 19 of the resonant part 13 is lost from the resonator either by dispersion or absorption of the acoustic wave. The larger the value of $\Delta$, the greater the rate of exponential decreasing of the amplitude of the acoustic displacement and the greater the amount of energy trapping. When the amount of acoustic energy which is lost by inadequate energy trapping is large, then the equivalent series resistance is large.

It is normally desired that a quartz crystal resonator have a relatively small equivalent series resistance. Therefore, the value of $\Delta$ and the length of quartz plate between the edges of the electrodes 16, 17 and the edges 18 and 19 of the resonant part 13 are design considerations in determining the dimensions of the quartz plate 10 and the resonant part 13 so that the quartz crystal resonator meets the requirements of the intended application, such as they may be.

Conductive metallic appendages extend from the top electrode 14 and the bottom electrode 15 to terminal electrode areas 20, 21 of the quartz crystal resonator plate 10. The significance of the terminal electrode areas 20, 21 is that they line up with base terminal electrode areas 26, 27 on the upper internal surface 23 of the quartz base plate 22 which is shown in FIG. 3. Conductive epoxy is applied so that it connects the terminal electrode area 20 to base terminal electrode area 26 and terminal electrode area 21 to base terminal electrode area 27.

The quartz plate 10, including electrodes 14 and 15, is bonded to quartz base plate 22, which is shown in FIGS. 3A and 3B, using a conventional epoxy adhesive. The quartz base plate 22 has about the same crystallographic orientation as the quartz crystal plate 10 so that the thermal expansion characteristics of the base plate and the plate 10 are substantially or essentially the same. However, for applications having somewhat less stringent requirements or specifications, base plates of quartz having crystallographic orientations dissimilar from the plate 10 or of materials other than quartz can be employed. FIG. 3A shows the upper internal surface 23 of base plate 22, while FIG. 3B shows the lower external surface 24 of the quartz base plate 22.

The lateral dimensions of the quartz crystal plate 10 are essentially the same as the quartz base plate 22. The metallic electrode pattern 25, 28 on the upper internal surface 23 is such that metallic electrode leads extend from each of the terminal electrode areas 26 and 27 to metallic electrodes 25 and 28, respectively, which in turn wrap around the edges of the base plate 22 to connect to terminal electrode areas 29 and 30, respectively, on the lower external surface 24 of the quartz base plate 22. A conventional conductive epoxy adhesive is applied so that it connects the terminal electrode areas 20, 21 on the quartz plate 10 with base terminal electrode areas 26, 27 on the upper internal surface 23, which are in turn connected via the metallic electrode pattern with the terminal electrode areas 29, 30 on the lower external surface 24. The metallic electrodes 14, 15 which drive the resonant part 13 of the quartz plate 10 are thus connected to terminals 29, 30 on the lower external surface 24 of the base plate 22.

In FIG. 3B, four terminal electrode areas 29, 30, 31, 32 are shown on the lower external surface 24 of the quartz base plate 22. However, only two terminal areas 29, 30 are part of the electrical circuit. The two other terminal areas 31, 32 are functional only in that they are soldered or fixed to the application printed circuit board and aid in locating and holding the final surface mount quartz resonator in place. The number of electroded terminal areas could be reduced to two and their location on the lower external surface 24 would be that which best fits the requirements of the application. The conductive metallic electrode patterns on the surfaces 23 and 24 of the quartz base plate 22 are vacuum deposited thin metallic films. However, they can be placed on the surfaces by other means as well.

Figure 4:
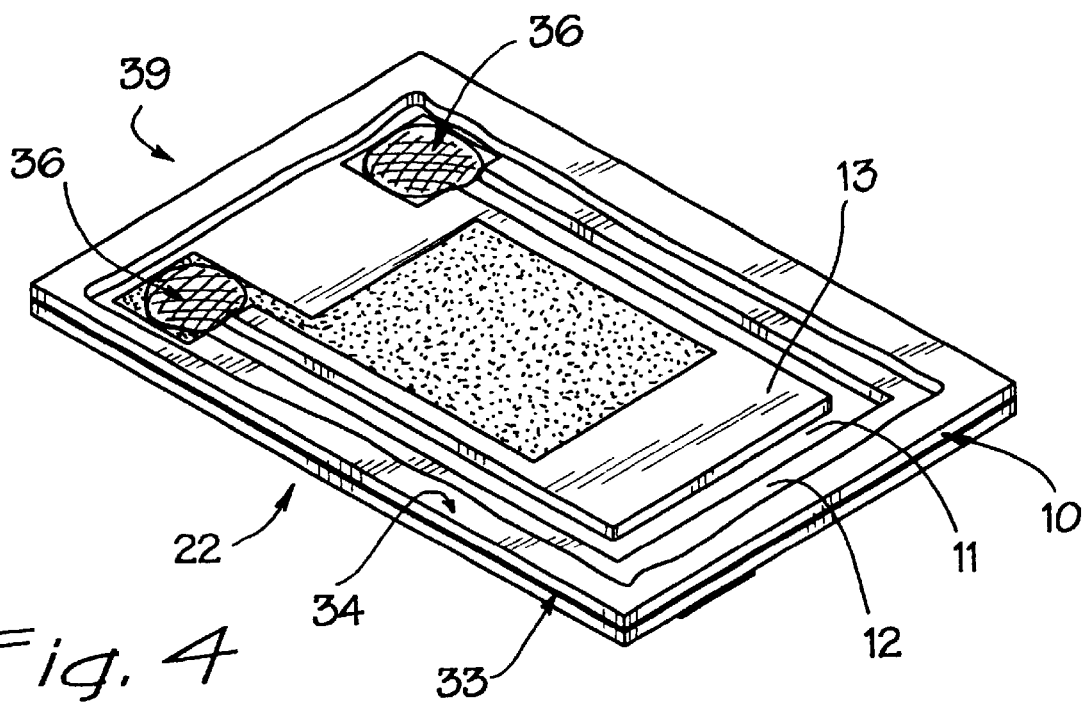
FIG. 4 is a perspective illustration of the piezoelectric quartz resonator plate shown in FIG. 2 bonded to the quartz base plate.

The assembly of the quartz crystal plate 10 to the quartz base plate 22 utilizes conventional epoxy adhesive 34 as is shown in FIG. 4. Epoxy adhesive 34 is applied to the perimeter of either the plate 10 or the base plate 22. The application of the epoxy adhesive around the plate perimeter forms epoxy adhesive 34 into a frame having a width is less than the width of the border 12 of the quartz crystal plate 10. The plate 10 and base plate 22 are then positioned one on top of the other and seated so that the epoxy adhesive 34 completely contacts the facing surfaces of both plates. Care is taken to insure that no epoxy adhesive bridges the slot 11 in the quartz plate 10 between the border 12 and the resonant part 13. The epoxy adhesive 34 has the dual purpose of mechanically bonding the two plates 10 and 22 together and forming a hermetic seal around the joining perimeter. Note that the outer perimeter 33 of adhesive layer 34 substantially coincides with the outer perimeters of plates 10 and 22. The thickness of the epoxy adhesive layer 34 is sufficient to keep the resonant part 13 from touching or making contact with the quartz base plate 22 when the part 13 is resonating.

Conventional conductive epoxy 36 is applied so that it connects the terminal electrode areas 20 and 21 of the quartz plate 10 and the terminal electrode areas 26 and 27, respectively, on the base plate 22. After the application of the epoxy adhesive 34 and 36, the adhesives are allowed to cure in accordance with the specification of the manufacturers of the adhesive. Adhesives 34 and 36 can be cured at the same time.

After the adhesives 34 and 36 have been properly cured, the assembly 39 of the plate 10 and base plate 22 may be tested before further processing. This can be accomplished by contacting the terminal electrode areas 29, 30 and using the appropriate instruments for performing the tests that are required. As is normal in the case of quartz crystal resonators, the frequency preferably is adjusted to the required frequency before completing the assembly and sealing on the cover.

Figure 5:
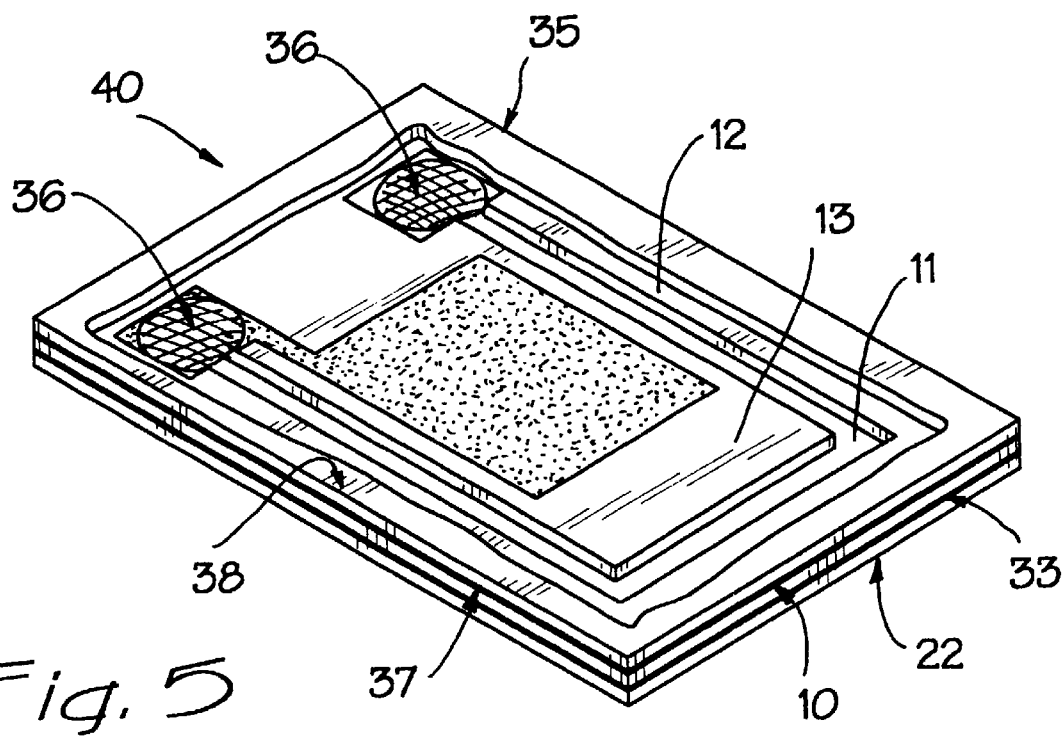
FIG. 5 is a perspective illustration of a surface mount quartz crystal resonator in accordance with the present invention.

As shown in FIG. 5, the quartz cover plate 35 has essentially the same dimensions as the quartz base plate 22 but the quartz cover plate has no functional electrodes. The quartz cover plate 35 is transparent and the electrodes of the quartz crystal plate 10 and the quartz base plate 22 can be seen through the cover plate. However, the surface of the quartz cover plate 35 is used for marking the device for identification.

The quartz cover plate 35 is bonded to the assembly of the quartz plate 10 and the quartz base plate 22 in substantially the same way the quartz base plate 22 was joined to the quartz resonator plate. Conventional epoxy adhesive 38 is applied to the border 12 of the quartz plate 10. The width of the application of epoxy adhesive 38 around the perimeter of the quartz plate 10 is narrower than the border 12 to insure that excess epoxy adhesive does not bridge the slot 11 between the border 12 and the resonant part 13 of the quartz plate 10. If excess epoxy adhesive should be inadvertently placed onto the resonant part 13 the resonant characteristics would be detrimentally affected depending on how much epoxy adhesive was so placed. The outer perimeter 37 of epoxy adhesive 38 substantially coincides with the outer perimeter of plate 10, base plate 22, and cover plage 35.

After the epoxy adhesive 38 is applied, the cover plate 35 is then placed on top of the assembly and seated so that the perimeter of the cover plate 35 is completely in contact with the epoxy adhesive 38 and no voids are present. This latter step is performed in a glove box which contains dry nitrogen gas so that the quartz crystal resonator part 13 is hermetically sealed and filled with the inert gas dry nitrogen. The epoxy adhesive 38 is cured in the same inert gas in accordance with the specifications of the adhesive manufacturer.

The epoxy adhesive has a certain viscosity and surface tension which supports the three quartz plates 22, 10 and 35 during assembly and keeps them from touching after cure. It is important the central resonant part 13 not be in contact with either the quartz base plate 22 or the quartz cover plate 35. Such contact may prevent resonance from occurring or result in high equivalent series resistance of the resonator. If for any reason the design may require that the central resonant part be thicker than the perimeter border then the central part of the quartz cover and base plate can be recessed sufficient, as described hereinafter, so that contact is avoided.

A feature of the invention lies in the fact that the temperature coefficients of expansion of the quartz crystal plate 10, the quartz base plate 22 and the quartz cover plate 35 are the same so the stresses which arise from the use of dissimilar materials for the base and cover according to old art are avoided.

A feature of this invention, resulting from the structure of the resonator assembly 40, is that the resonant part 13 of the quartz crystal resonator plate 10 is supported within the cavity which is formed by the border 12 of the quartz plate 10, the quartz base plate 22, the cover plate 35 and the thicknesses of the epoxy adhesives 33 and 38 around the perimeter bonding the assembly together. The quartz plate 10 is not separated from the base plate 22 and the cover plate 35, as is often the case with the prior art. The strength of the quartz supporting the resonant part 13 is much greater than two small dots of conductive epoxy which supports the resonator element of surface mount quartz crystal resonators in the prior art.

Figure 6:
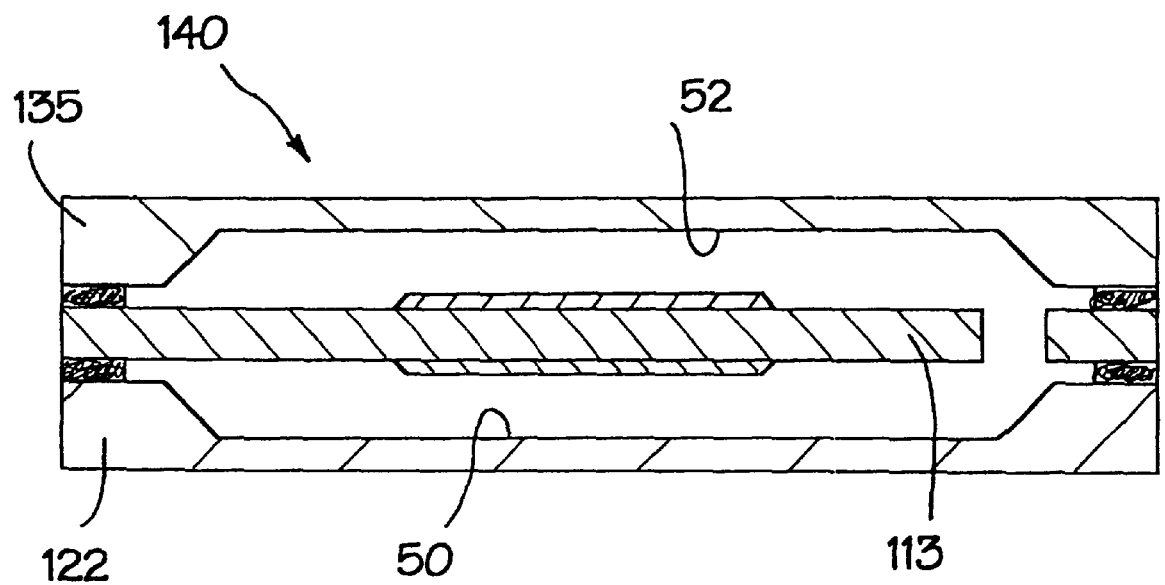
FIG. 6 is a cross-sectional view of an alternate embodiment of a surface mount quartz crystal resonator in accordance with the present invention.

FIG. 6 illustrates an alternate embodiment of a surface mount quartz crystal resonator assembly in accordance with the present invention. Except as expressly described herein, this alternate resonator assembly, shown generally at 140, is structured and functions in a manner similar to that described previously with regard to resonator assembly 40. Components of alternate resonator 140 which correspond to components of resonator assembly 40 are identified by the same reference numeral increased by 100.

With reference to FIG. 6, the primary difference between alternate resonator assembly 140 and resonator assembly 40 is that the cover plate 135 and the base plate 122 include recesses. In particular, base plate 122 includes an outwardly extending recessed area 50, and cover plate 135 includes an outwardly extending recess area 52. These recessed areas or regions 50 and 52 can be produced by conventional methods. Such recessed areas are designed to provide additional space within which resonate part 113 can resonate without coming in contact with either the base plate 122 or the cover plate 135. This embodiment is particularly useful when it is desired to reduce the size, for example, the profile, of the resonator.

Figure 7A:
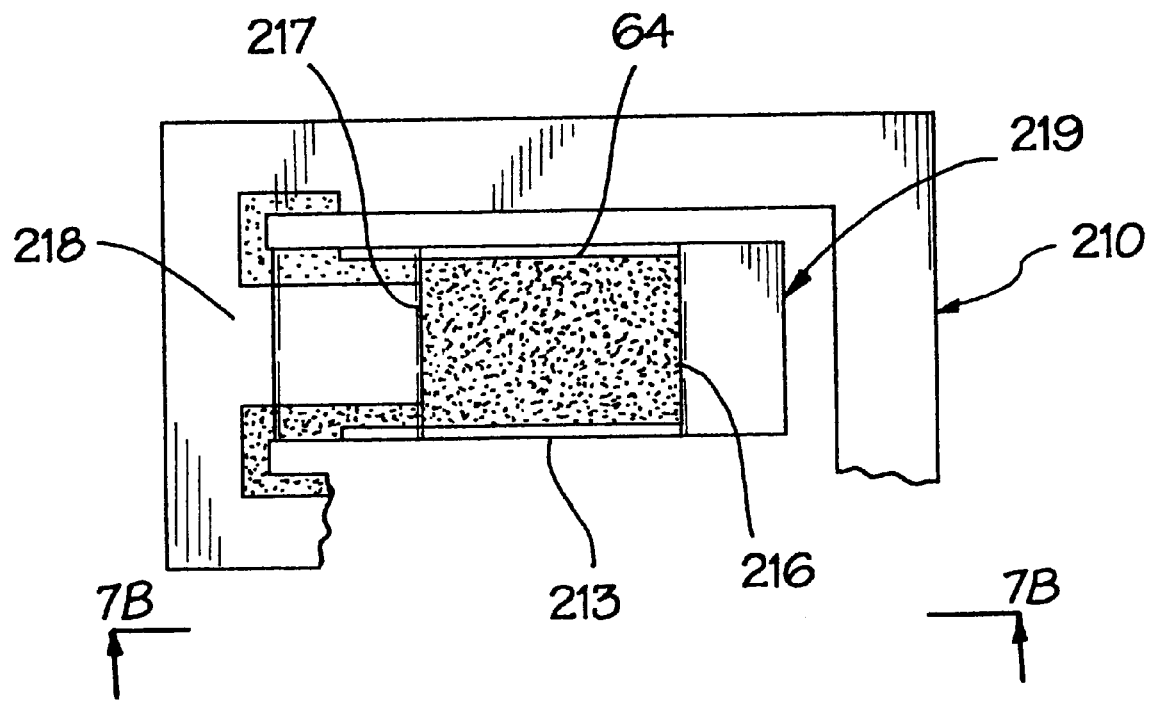
FIGS. 7A and 7B are a partial top view and a cross-sectional view, respectively, of another piezoelectric quartz resonator plate in accordance with the present invention.
Figure 7B:
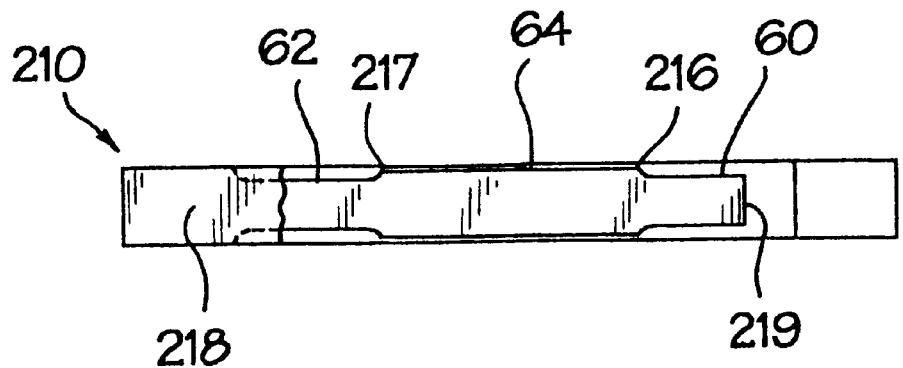

FIGS. 7A and 7B illustrate another embodiment of a quartz crystal plate in accordance with the present invention. Except as expressly described herein, this other quartz crystal plate, shown generally at 210, is structured and functions in a manner similar to that previously described with regard to plate 10. Components of other plate 210 which correspond to components of plate 10 are identified by the same reference numeral increased by 200.

The other plate 210 deals with the energy trapping phenomenon, which has been previously discussed with reference to FIG. 2. In some applications, which require small overall size, the design of the resonant part 213 of the quartz resonator plate 210 require a very large value of $\Delta$ to achieve the necessary energy trapping for the design to result in an acceptably low value of the equivalent resistance. Normally the desired value of $\Delta$, mass loading is achieved by the thickness of the electrode 14 which is deposited onto the resonant part 13 of the quartz plate 10. However, because the metallic electrode material has a much lower internal mechanical Q than quartz, using electrodes which are relatively thick increases the equivalent resistance.

An alternative to increasing the electrode thickness is shown in FIGS. 7A and 7B. The frequency of the thickness shear mode which is employed in this embodiment of the invention is inversely proportional to the thickness of the quartz resonator plate 210 and can be expressed by the EQN. 1, noted above. If the thickness of the resonant part 213 is reduced, as shown in FIG. 7, between the edges of the electrode 216, 217 and the edges of the resonant part 218, 219 then the frequency in those regions 60, 62 will be much higher than the frequency in the electroded region 64. For example, if the thickness is decreased by 10% then the frequency, ignoring other factors, will increase by about 10%. Since the mass loading, $\Delta$, as given by EQN. 2, is proportional to the difference between the frequency in the unelectroded region 60, 62 and the frequency in the electroded region 64, then the mass loading $\Delta$ can be increased without having excessively thick electrodes but by decreasing the thickness of the quartz plate outside of the electroded area 64. This method enables the designs to achieve high levels of energy trapping and good values of equivalent resistance, and still be of small, compact size.

Quartz resonators of higher frequency are becoming of increased importance. However, as given in EQN. 1 as the frequency of the resonator increases its thickness must correspondingly decrease. The thinner the quartz plate the more fragile it becomes and the more difficult it is to process through the manufacturing process. One alternative is to use overtones of the fundamental frequency which allows for a thicker plate to be used for higher frequencies. However, the equivalent circuit of an overtone mode resonance has higher equivalent resistance and much lower motional capacitance than the fundamental mode resonance. For this reason in many applications the fundamental mode is required.

Figure 8A:
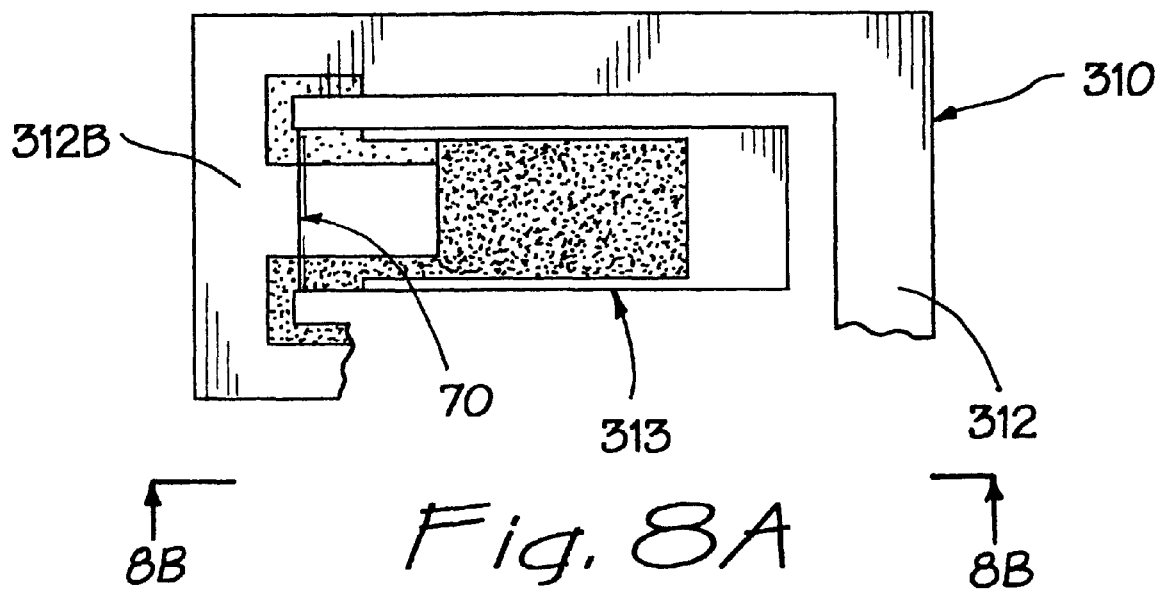
FIGS. 8A and 8B are a partial top view and a cross-sectional view, respectively, of a further piezoelectric quartz resonator plate in accordance with the present invention.
Figure 8B:
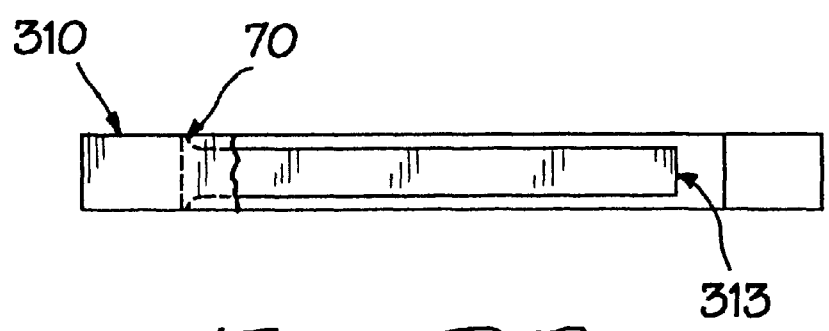

FIGS. 8A and 8B illustrate a further embodiment of a quartz crystal plate in accordance with the present invention. Except as expressly described herein, this further quartz crystal plate, shown generally at 310, is structured and functions in a manner similar to previously described with regard to plate 10. Components of further plate 310 which correspond to components of plate 10 are identified by the same reference numeral increased by 300.

As shown in FIGS. 8A and 8B, the central portion 313 of the quartz crystal plate 310 is reduced in thickness so that its resonant frequency meets that required by the application. This may be accomplished using any suitable technique, for example, by selectively etching the central portion 313, while leaving the border 312 to be much thicker and stronger. The thickness transition 70 lies between the border region 312B and the central portion 313. Using this approach a very thin central portion 313 plate 310 having high resonant frequencies can be achieved without sacrificing the thickness and strength of the border 312.

While this invention has been described with respect to various specific examples and embodiments, it is to be understood that the invention is not limited thereto and that it can be variously practiced within the scope of the following claims.

What is claimed is:

1. A resonator assembly comprising:
    (a) a quartz crystal-based resonator plate including a central portion and a border substantially surrounding the central portion, the central portion and border formed by removal of material from a solid quartz crystal plate,
        wherein the border includes a first region physically separated from the central portion and a second region joined to the central portion, and
        wherein the resonator plate includes a crystallographic orientation wherein a length of the resonator plate is aligned along the X-crystallographic axis of the quartz crystal material forming the resonator plate;
    (b) a plurality of terminal electrode areas disposed on the resonator plate;
    (c) a quartz crystal-based base plate secured to the resonator plate, and including no through holes;
    (d) a plurality of terminal electrode areas disposed on the base plate, and includes no through holes; and
    (e) a conductive adhesive disposed between the terminal electrode areas on the base plate and the terminal electrode areas on the resonator plate.

2. A resonator assembly comprising:
    (a) a quartz crystal-based resonator plate including a central portion and a border substantially surrounding the central portion, the central portion and border formed by removal of material from a solid quartz crystal plate, wherein the border includes a first region physically separated from the central portion and a second region joined to the central portion, and wherein the central portion has a top surface and an opposing bottom surface, and the resonator plate includes a first electrode on the top surface and a second electrode on the bottom surface, each electrode extending to a terminal electrode area on the resonator plate, and the central portion is adapted to resonate in response to an alternating voltage being applied thereto, and wherein the central portion has a region with a thickness greater than a thickness of the border, the region being provided with the electrodes, and wherein the resonator plate includes a crystallographic orientation wherein a length of the resonator plate is aligned along the X-crysrallographic axis of the quartz crystal material forming the resonator plate;

(b) a quartz crystal-based base plate secured to the resonator plate;

(c) a plurality of terminal electrode areas disposed on the base plate; and (d) a conductive adhesive disposed between the terminal electrode areas of the base plate and the terminal electrode areas on the resonator plate.

3. The resonator assembly of claim 2, further comprising a non-conductive adhesive disposed between the base plate and the resonator plate border.

4. A resonator plate comprising:

a quartz crystal-based plate including a central portion having a length, a width, a top surface, and a bottom surface and a peripheral region between the top and bottom surfaces;

a border substantially surrounding the peripheral region, wherein the central portion is separated from the border by a slot along three sides of the peripheral region and is connected to the border along a major portion of a fourth side of the peripheral region; and a crystallographic orientation wherein a length of the plate is aligned along the X-crystallographic axis of the quartz crystal forming the plate.

5. The plate of claim of claim 4, further comprising a first electrode disposed on the top surface of the central portion and a second electrode disposed on the bottom surface of the central portion, the central portion structured to vibrate in response to an alternating voltage being applied thereto.

6. The plate of claim 5 wherein the central portion is structured to vibrate at a thickness shear mode in response to an alternating voltage being applied thereto.

7. The assembly of claim 4 wherein a width and a depth of the resonator plate are aligned along the Z'-crystallographic axis and the Y'-crystallographic axis respectively, of the quartz crystal material forming the resonator plate.

8. The assembly of claim 4 wherein the central portion has a region with a thickness greater than a thickness of the border, the region being provided with the electrodes.

9. The assembly of claim 4 wherein the central portion includes at least one region with a thickness which is reduced, relative to a thickness of the border, the at least one region being provided with neither the first nor second electrodes.

10. The plate of claim 4 further comprising conductive edge plating effective in providing conductivity between the first and second electrodes connected to the electrodes.

11. A resonator assembly comprising:

(a) a quartz crystal-based resonator plate including a central portion and a border substantially surrounding the central portion, the central portion and border formed by removal of material from a solid quartz crystal plate, wherein the border includes a first region physically separated from the central portion and a second region joined to the central portion, and wherein the resonator plate includes a crystallographic orientation wherein a length of the resonator plate is aligned along the X-crystallographic axis of the quartz crystal material forming the resonator plate;

(b) a quartz crystal-based base plate secured to the resonator plate; and (c) an adhesive disposed between the base plate and the border of the resonator plate.

12. The assembly of claim 11 wherein the adhesive has a thickness providing adequate separation between the resonator plate and the base plate so that the central portion is free to resonate without interference with the base plate.

13. The assembly of claim 11 wherein the resonator plate has a rectangular outer periphery and includes a slot located between the central portion and the first region, the slot being located inwardly of the outer periphery along at least three sides of the outer periphery.

14. The assembly of claim 11 wherein a width and a depth of the resonator plate are aligned along the Z'-crystallographic axis and the Y'-crystallographic axis respectively, of the quartz crystal material forming the resonator plate.

15. The assembly of claim 11 wherein the base plate has a crystallographic orientation substantially the same as the crystallographic orientation of the resonator plate.

16. The assembly of claim 11 wherein the central portion has a top surface and an opposing bottom surface, and the resonator plate includes a first electrode on the top surface and a second electrode on the bottom surface and the central portion is adapted to resonate in response to an alternating voltage being applied thereto.

17. The assembly of claim 16 wherein the central portion has a region with a thickness greater than a thickness of the border, the region being provided with the electrodes.

18. The assembly of claim 16 wherein the central portion includes at least one region with a thickness which is reduced, relative to at least one other region of the central portion, the at least one region being provided with neither the first nor second electrode.

19. The assembly of claim 16 wherein the central portion includes at least one region with a thickness which is reduced, relative to a thickness of the border, the at least one region being provided with neither the first nor second electrode.

20. The assembly of claim 16 wherein the base plate includes an exterior surface and at least one terminal electrode disposed on the exterior surface.

21. The assembly of claim 20 further comprising conductive edge plating on the resonator plate effective in providing conductivity between the first electrode and the at least one terminal electrode.

22. The assembly of claim 16 wherein the base plate includes an exterior surface and a plurality of terminal electrodes disposed on the exterior surface, and the base plate further includes conductive edge plating positioned to provide conductivity between the first electrode and one of the terminal electrodes, and between the second electrode and another of the terminal electrodes.

23. The assembly of claim 11 wherein the base plate includes no through hole.

* * * * *